(12) United States Patent
Fang

(10) Patent No.: US 6,872,652 B2
(45) Date of Patent: Mar. 29, 2005

(54) METHOD OF CLEANING AN INTER-LEVEL DIELECTRIC INTERCONNECT

(75) Inventor: Sunfei Fang, LaGrangeville, NY (US)

(73) Assignee: Infineon Technologies AG, Munich (DE)

( * ) Notice: Subject to any disclaimer, the term of this patent is extended or adjusted under 35 U.S.C. 154(b) by 173 days.

(21) Appl. No.: 09/941,963

(22) Filed: Aug. 28, 2001

(65) Prior Publication Data

US 2003/0045115 A1 Mar. 6, 2003

(51) Int. Cl.$^7$ .......................................... H01L 21/4763
(52) U.S. Cl. ....................... 438/623; 438/637; 438/700; 438/725; 438/780
(58) Field of Search .............................. 438/623, 637, 438/700–710, 725, 780, 798; 257/642, 774, 758

(56) References Cited

U.S. PATENT DOCUMENTS

| | | | |
|---|---|---|---|
| 4,098,956 A | * | 7/1978 | Blickensderfer et al. .... 428/627 |
| 4,357,203 A | | 11/1982 | Zelez |
| 4,585,517 A | | 4/1986 | Stemple |
| 5,043,299 A | | 8/1991 | Chang et al. |
| 5,849,367 A | * | 12/1998 | Dixit et al. ................. 427/535 |
| 5,900,163 A | * | 5/1999 | Yi et al. ........................ 216/79 |
| 6,042,929 A | * | 3/2000 | Burke et al. ................ 428/141 |
| 6,132,564 A | | 10/2000 | Licata |
| 6,169,036 B1 | | 1/2001 | Bhowmik et al. |
| 6,204,550 B1 | | 3/2001 | Wang et al. |
| 6,284,657 B1 | * | 9/2001 | Chooi et al. ................ 438/687 |
| 6,294,458 B1 | * | 9/2001 | Zhang et al. ............... 438/627 |
| 2001/0049150 A1 | * | 12/2001 | Nakagawa et al. ............ 438/8 |
| 2003/0024902 A1 | * | 2/2003 | Li et al. ....................... 216/67 |

FOREIGN PATENT DOCUMENTS

| | | |
|---|---|---|
| EP | 1081751 A2 | 3/2001 |
| JP | 00246246 | 10/1990 |
| JP | 200118846 | 10/1999 |
| JP | 2001217400 | 8/2001 |
| WO | WO 00/34997 | 6/2000 |
| WO | WO 01/29879 A2 | 4/2001 |

OTHER PUBLICATIONS

Zhao, B., et al., "Integration of Low Dielectric Constant Materials in Advanced Aluminum and Copper Interconnects," Mat. Res. Soc. Symp. Proc., vol. 564, 1999 Materials Research Society, pp. 485–497.

* cited by examiner

*Primary Examiner*—Hsien-Ming Lee
(74) *Attorney, Agent, or Firm*—Slater & Matsil, L.L.P.

(57) ABSTRACT

A method for cleaning a semiconductor interconnect structure formed in an organic ILD using an anisotropic organic dielectric etch in combination with a sputter clean process. Organic material displaced from the sidewalls to the bottom of the structure by the sputter clean is removed by the ion enhanced organic etch. Interconnect resistance shift is reduced and reliability of the interconnect structure is improved by removing contaminates at the interface of the via/contact, and by increasing adhesion of the liner or plug to the underlying conductive layer.

22 Claims, 2 Drawing Sheets

| PLASMA POWER (W) | ETCH RATE (Å/min) |
|---|---|
| 500 | 23 |
| 700 | 21 |
| 900 | 18 |

FIG. 5

| TEST | RF BIAS (W) | ETCH CHEMISTRY (sccm) | ETCH RATE (Å/min) |
|---|---|---|---|
| A | 0 | Ar ONLY: 120 | 46 |
| B | 300 | Ar ONLY: 120 | 660 |
| C | 0 | N2 ONLY: 100 | 454 |
| D | 300 | N2 ONLY: 100 | 3068 |
| E | 0 | Ar/N2: 100/20 | 322 |
| F | 100 | Ar/N2: 100/20 | 1280 |
| G | 300 | Ar/N2: 100/20 | 2712 |
| H | 500 | Ar/N2: 100/20 | 3474 |

FIG. 6

METHOD OF CLEANING AN INTER-LEVEL DIELECTRIC INTERCONNECT

TECHNICAL FIELD

This invention relates generally to semiconductor processing, and more particularly to cleaning an interconnect formed in an inter-level dielectric.

BACKGROUND

Semiconductor devices typically contain interconnects, such as vias and contacts, which connect conductive elements in non-successive layers within a semiconductor device. A via generally connects two metallic elements in different layers of a semiconductor device. A contact generally connects metallic and non-metallic conducting or semiconducting (such as silicon, polysilicon, or silicide) elements in different layers of a semiconductor device. As used herein, a "conductive" element or layer is defined to include both conducting and semiconducting elements or layers. The interconnect is typically formed in an inter-level dielectric ("ILD") layer disposed between the layers to be connected. A common dielectric material used for the ILD is silicon dioxide, but more recently organic materials providing lower dielectric constants, such as SiLK (silicon low-k) semiconductor dielectric resins, available from The Dow Chemical Company, and other polymers and cross linked polyarylene ether polymers, have been used or proposed for the ILD.

Generally, the ILD is formed on one of the conductive layers to be connected, and a hole or trench is etched into the ILD using, for example, plasma etching or reactive ion etching. The lower conductive layer forms the bottom of the hole. A liner may be formed in the hole, for example using physical vapor deposition, by coating the walls and floor of the hole with a diffusion barrier material, such as tungsten nitride, tantalum nitride, titanium nitride, or titanium tungsten. A plug is generally formed by depositing (e.g., using chemical vapor deposition or electroplating) conductive material (e.g., tungsten or copper) in the hole. The surface of the wafer may be planarized, for example with chemical mechanical polishing, and then the second layer to be connected is formed on the ILD. This layer is typically a metal layer, such as an aluminum alloy (e.g., aluminum copper) or copper, although it may be composed of other conductive materials.

After the hole is etched, but before the liner or plug are formed, the hole is typically cleaned (also referred to as "pre-cleaning") to remove any oxide from the surface of the lower conductive layer, as well as any other residue left from the etch chemistry used to form the hole. The cleaning may be performed with a wet etch technique, but it is generally preferable to use a dry etch process such as radio frequency ("RF") sputtering with, for example, an argon plasma, to physically etch the surface oxide. The sputter clean process of the prior art, however, may itself cause problems with the interconnect, in particular when an organic ILD is used. One disadvantage of the prior art is that organic ILD material may be dislodged from the sidewalls of the hole when plasma ions collide with the sidewalls, and then may deposit on and contaminate the lower conductive layer and increase contact resistance. Another disadvantage of the prior art is that the re-deposited organic byproduct may degrade the adhesion of the liner or plug to the underlying conductive layer. In addition, the redeposited organic material may cause interconnect reliability problems, such as interconnect resistance shift during thermal stress.

SUMMARY OF THE INVENTION

These and other problems are generally solved or circumvented, and technical advantages are generally achieved, by preferred embodiments of the present invention which comprise cleaning a semiconductor interconnect structure formed in an organic ILD using an anisotropic organic dielectric etch in combination with a sputter clean process.

In accordance with a preferred embodiment of the present invention, a method for cleaning a hole formed in an organic ILD comprises performing an RF sputter clean of the hole, and performing an anisotropic, ion enhanced organic etch of the hole at least partially during the sputter clean. The organic material displaced from the sidewalls to the bottom of the hole by the sputter clean is removed by the anisotropic organic etch.

In accordance with another preferred embodiment of the present invention, a method for cleaning an interconnect structure formed in an organic ILD comprises forming a plasma over the interconnect structure, the plasma comprising a physical etch component and an ion enhanced chemical etch component, directing the plasma toward the interconnect structure, sputter cleaning the bottom of the hole with the physical etch component, and anisotropically removing organic material from the bottom of the hole with the chemical etch component.

In accordance with another preferred embodiment of the present invention, a method for forming an interconnect through an organic ILD comprises forming a lower conductive layer on a semiconductor substrate, forming the organic ILD on the lower conductive layer, etching a hole through the organic ILD down to the lower conductive layer, performing an RF sputter clean of a bottom of the hole, performing an anisotropic, ion enhanced chemical organic etch of the hole, wherein the etch is performed at least partially during the RF sputter clean, forming a plug in the hole, and forming an upper conductive layer on the organic ILD and the plug.

An advantage of a preferred embodiment of the present invention is that it substantially reduces or eliminates the amount of organic material byproduct deposited on the surface of the lower conductive layer during pre-clean.

Another advantage of a preferred embodiment of the present invention is that it may be implemented with existing etch machinery and chemistry.

Another advantage of a preferred embodiment of the present invention is that the adhesion of the liner or plug to the underlying conductive layer is improved.

Another advantage of a preferred embodiment of the present invention is that interconnect resistance is reduced.

Yet another advantage of a preferred embodiment of the present invention is that interconnect resistance shift during thermal stress is reduced.

Still another advantage of a preferred embodiment of the present invention is that it improves the reliability of the interconnect structure.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the concepts and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawing, in which:

FIGS. 5 and 6 are tables of organic material etch rates for various plasmas.

Corresponding numerals and symbols in the different figures refer to corresponding parts unless otherwise indicated. The figures are drawn to clearly illustrate the relevant aspects of the preferred embodiments, and are not necessarily drawn to scale.

DETAILED DESCRIPTION OF PREFERRED EMBODIMENTS

The making and using of the presently preferred embodiment is discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a specific context, namely pre-cleaning an organic ILD interconnect. The invention may also be applied, however, to pre-cleaning interconnects formed in other materials, such as non-organic ILD interconnects. The invention may also be applied to the pre-cleaning or etching of other semiconductor structures, such as an element other than an interconnect formed in an organic ILD.

Figure 1:
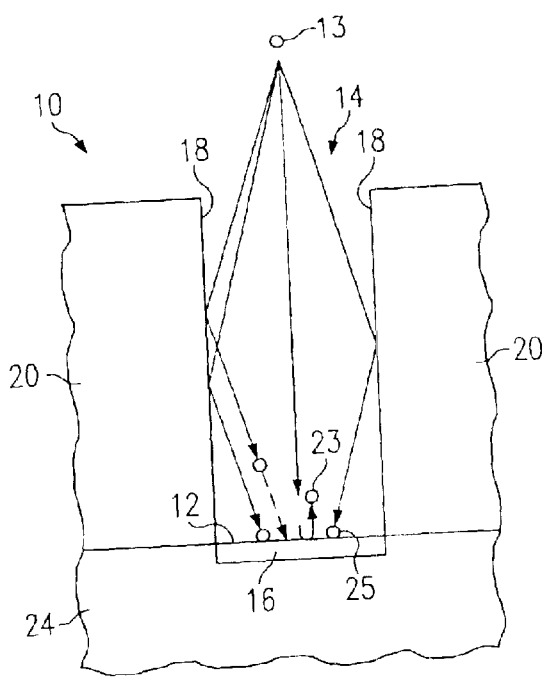
FIG. 1 illustrates a prior art sputter clean method.

With reference now to FIG. 1, there is illustrated a prior art method of cleaning an interconnect structure. At this stage of the interconnect formation process, interconnect structure 10 comprises lower conductive layer 24, and ILD 20 formed on lower conductive layer 24. Hole 14, having sidewalls 18, is etched in ILD 20 down to lower conductive layer 24. After etching hole 14, an undesirable surface oxide 16 has formed on exposed surface 12 of lower conductive layer 24. Therefore, prior to forming a liner or plug in hole 14, hole 14 is pre-cleaned to remove surface oxide 16, as well as any remaining etch chemistry contaminants. The pre-cleaning of exposed surface 12 before the liner formation and interconnect fill is intended to remove the oxide and contaminants and generally increase the reliability of interconnect structure 10.

During the RF sputter clean process of the prior art, an argon plasma is generated by treating argon gas with RF energy. The wafer containing the interconnect structure may be biased to a low potential or self-biased in the plasma, while the plasma of argon containing ions and electrons 13 is formed around the wafer surface. The low potential of the wafer accelerates the argon ions 13 into hole 14 to remove particles 23 of surface oxide 16, thus removing surface oxide 16 from exposed surface 12 of lower conductive layer 24. While the RF sputter clean process is primarily anisotropic, some of the argon ions and electrons 13 collide with sidewalls 18 of hole 14. When this happens, particles 25 of ILD 20 may be displaced from sidewalls 18 and re-deposited onto exposed surface 12 of conductive layer 24. The re-deposited ILD material 25 may cause increased contact resistance and reliability problems with interconnect 10.

Figure 2:
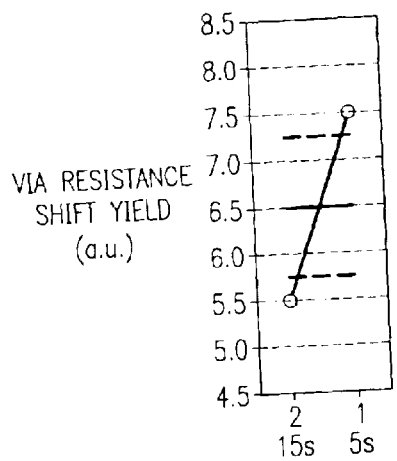
FIG. 2 is a chart showing impact on resistance shift yield using the prior art pre-clean method.

As an example, FIG. 2 is a chart illustrating the impact on resistance shift yield on an interconnect structure using the prior art cleaning process. In the first group, which is pre-cleaned with argon plasma for 5 seconds, the via resistance shift yield is about 7.5 arbitrary units (a.u.), while in the second group, which is pre-cleaned for 15 seconds, the via resistance shift yield degraded about 30% to about 5.5 (a.u.). Thus, as shown by FIG. 2, undesirable resistance shift affecting the reliability of an interconnect may result from the prior art argon sputter pre-clean process.

Figure 3:
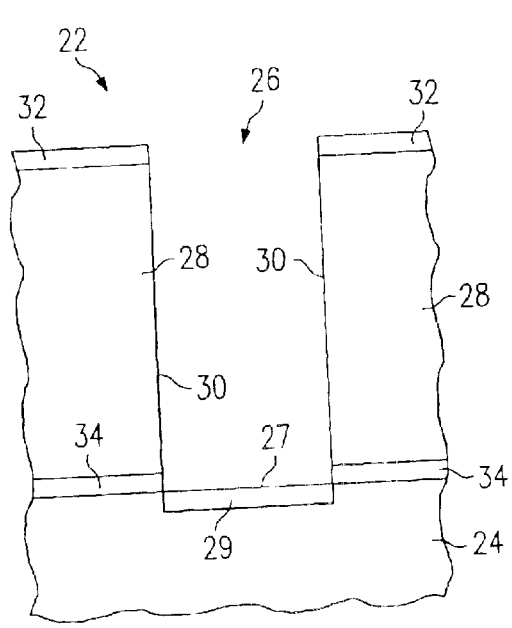
FIG. 3 illustrates a preferred embodiment organic ILD interconnect structure of the present invention.
Figure 4:
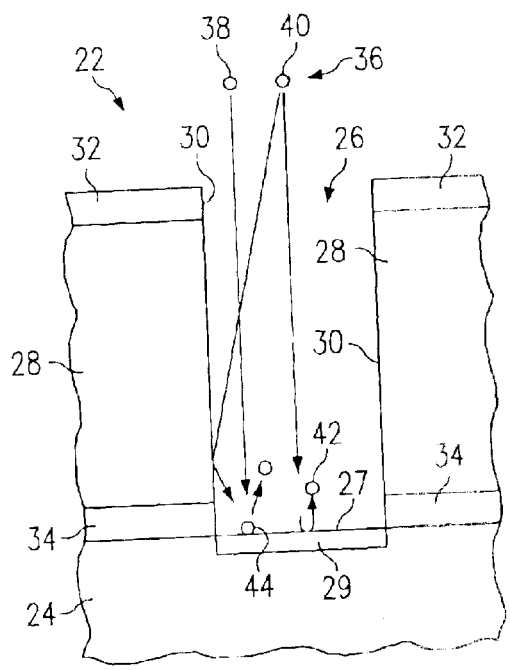
FIG. 4 illustrates a preferred embodiment interconnect clean method.

A preferred embodiment method of pre-cleaning an interconnect is illustrated in FIGS. 3 & 4. An ILD interconnect structure 22 prior to pre-clean is shown in FIG. 3. ILD structure 22 comprises a lower conductive layer 24, which is preferably a metal such as copper, but may be other materials such as doped polysilicon. Lower cap layer 34, which is preferably silicon nitride, but may be other materials such as titanium nitride, is disposed on lower conductive layer 24. Organic ILD 28 is disposed on lower cap layer 34, which is preferably silicon nitride, but may be other dielectric materials, or other materials such as titanium nitride. Upper cap layer 32, which is preferably silicon nitride, but may be other dielectric materials, or other materials such as titanium nitride, is disposed on organic ILD 28. A hole or trench 26 comprising sidewalls 30 is formed through upper cap layer 32 and organic ILD 28 down to exposed surface 27 of lower conductive layer 24. An undesirable surface oxide 29 formed unintentionally on exposed surface 27 of lower conductive layer 24.

FIG. 4 illustrates a preferred embodiment method of removing surface oxide 29 while substantially reducing or eliminating the re-deposition of dislodged organic ILD material from sidewalls 30. In this embodiment, a sputter clean process comprising, for example, argon plasma, is used to remove surface oxide 29, in combination with an anisotropic organic etch, which is used to remove re-deposited organic ILD material from exposed surface 27. Other types of plasmas may be used for the sputter clean, such as helium plasma. The anisotropic organic etch species is preferably nitrogen (e.g., $N/N_2$) containing plasma, although other anisotropic organic etch species may be used.

As shown in FIG. 4, plasma 36 comprises argon plasma components 40 and nitrogen plasma components 38. The argon plasma component functions as a sputter clean to remove surface oxide 29 from lower conductive layer 24 by dislodging surface oxide particles 42. However, some of the argon ions dislodge organic particles 44 from organic ILD sidewalls 30, which may then re-deposit on exposed surface 27 of lower conductive layer 24. The nitrogen plasma component is ion enhanced, and functions as an anisotropic chemical etch to remove organic particles 44 from exposed surface 27. Because it is anisotropic, the nitrogen etch does not significantly etch organic ILD material in sidewalls 30. Alternatively, plasma 36 may contain the anisotropic organic etch species alone, without the argon. The anisotropic etch species, such as nitrogen or nitride plasma, may perform both the sputter clean of the lower conductive layer and the removal of any redeposited organic ILD material from the lower conductive layer.

Experiments have shown that nitrogen containing plasma can be an excellent anisotropic etchant for organic films. Referring to FIG. 5, there is shown a chart of the etch rate of organic material by a nitrogen etch species in a remote plasma etcher for various power levels. For this experiment, the nitrogen plasma was generated in a separate chamber from the wafer chamber so that there was no electric field near the wafer. A downstream flow transferred the neutral nitrogen species to the wafer chamber to perform the etch without ion enhancement or bias. The etch rate was negligible, varying from about 18 to about 23 angstroms per minute, and had no relation to the power level. Therefore the etch rate of organic material by neutral nitrogen species is minimal or negligible without ion enhancement or bias. Generally, because lateral etching in a plasma system is mainly contributed by neutral species without ion enhancement, the minimal or negligible etch rate in remote nitrogen plasma indicates that there will be little etch in the lateral direction.

As shown in FIG. 6, the etch rate of organic material is significantly increased with local ion enhancement around or proximate the wafer. Experiments were run for different etch chemistries with varying RF biases using a high density plasma etcher. For each of the etch chemistries, argon only, nitrogen only, and argon/nitrogen combination, etching of the organic material increased significantly with ion enhancement. Using argon alone at a flow rate of 120 sccm, the etch rate of organic material increased from 46 angstroms/minute to 660 angstroms/minute when the RF bias was increased from 0 watts to 300 watts. With nitrogen alone at a flow rate of 100 sccm, the etch rate of organic material increased from 454 angstroms/minute to 3068 angstroms/minute when the RF bias was increased from 0 watts to 300 watts. The etch rate of organic material with nitrogen plasma is over 10 times faster, even at a bias power of 0 Watts, compared to that with remote nitrogen plasma. Generally, this is due to self-bias, wherein a negative potential builds up on a wafer directly exposed to plasma. With nitrogen plasma, the vertical etch rate of organic material increases about 10 times when the bias power increases from 0 to 300 Watts. Generally, this shows that the vertical etch rate of organic material in a local nitrogen plasma can be over 100 times higher than the lateral etch rate obtained from a remote plasma etch. Finally, with combined argon/nitrogen at a flow rate of 100 sccm and 20 sccm, respectively, the etch rate of organic material was 322 angstroms/minute for an RF bias of 0 watts, which increased to 1280 angstroms/minute for an RF bias of 100 watts, 2712 angstroms/minute for an RF bias of 300 watts, and 3474 angstroms/minute for an RF bias of 500 watts. While the ion enhancement increased the etch rate of organic material for argon alone, the etch rate was still much higher using nitrogen alone or nitrogen in combination with argon than it was for argon alone. The above results indicate that nitrogen and nitrogen/argon mixed plasmas are excellent anisotropic etchants for organic material.

Once surface oxide 29 is removed from interconnect structure 22 by the combined argon sputter clean and ion enhanced nitrogen plasma chemical clean, the liner and plug may be formed in the interconnect hole, followed by the formation of the upper conductive layer on the structure.

Although the present invention and its advantages have been described in detail, it should be understood that various changes, substitutions and alterations can be made herein without departing from the spirit and scope of the invention as defined by the appended claims. For example, the sputter clean and ion enhanced chemical clean may start and stop at about the same time, they may overlap only part of the time, or they may be non-overlapping. As a specific example, the sputter clean may be started, and then the ion enhanced organic chemical clean started, followed by the completion of the sputter clean and then completion of the ion enhanced organic chemical clean.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of removing surface oxide from the surface of a conductive layer forming the bottom of a hole formed in an organic inter-level dielectric (ILD), the hole having sidewalls and said bottom, the organic ILD disposed on a semiconductor substrate, the method comprising:

performing a radio frequency (RF) sputter clean of the hole to remove said surface oxide; and performing an anisotropic, ion enhanced etch, at least partially during the sputter clean, of organic material displaced from the sidewalls of the hole and deposited at the bottom of the hole by the sputter clean.

2. The method of claim 1, wherein the ion enhanced etch of the organic material comprises a nitrogen plasma.

3. A method of removing surface oxide from the surface of a conductive interconnect structure formed in an organic ILD, the structure comprising a hole having a bottom formed by the surface of said conductive interconnect structure and sidewalls, the structure disposed on a semiconductor substrate, the method comprising:

forming a plasma over the interconnect structure, the plasma comprising a physical etch component and an ion enhanced chemical etch component;

directing the plasma toward the interconnect structure;

sputter cleaning the surface oxide from the bottom of the hole with the physical etch component; and anisotropicaily removing organic material displaced from the sidewalls and deposited at the bottom of the hole with the chemical etch component.

4. The method of claim 3, wherein the chemical etch component comprises nitrogen.

5. The method of claim 3, wherein the physical etch component comprises argon.

6. The method of claim 3, wherein the physical etch component comprises helium.

7. The method of claim 3, wherein the chemical etch is ion enhanced with an RF bias of between about 0 watts and about 500 watts.

8. A method of forming an interconnect through an organic ILD, the method comprising:

forming a lower conductive layer on a semiconductor substrate;

forming the organic ILD on the top surface of said lower conductive layer;

etching a hole through the organic ILD down to the lower conductive layer;

perfomung an RF sputter clean of a surface oxide from the top surface of said lower conductive layer forming the bottom of the hole;

performing an anisotropic, ion enhanced chemical etch of organic ILD material deposited in the hole during said RF sputter clean, wherein the etch is performed at least partially during the RF sputter clean;

forming a plug in the hole; and forming an upper conductive layer on the organic ILD and the plug.

9. The method of claim 8, wherein said RF sputter clean comprises using an argon plasma.

10. The method of claim 8, wherein said RF sputter clean comprises using a helium plasma.

11. The method of claim 8, wherein said etch of organic ILD material comprises using a nitrogen plasma.

12. The method of claim 8, further comprising:

forming a lower cap layer on the lower conductive layer before the forming of the organic ILD layer; and forming an upper cap layer on the organic ILD layer, wherein the etching of the hole further comprises etching through the upper cap layer and lower cap layer.

13. The method of claim 8, further comprising forming a liner in the hole before the forming of the plug.

14. A method of cleaning a previously etched hole formed in an organic inter-level dielectric (ILD), the hole having a sidewall surface defined by said organic ILD and a bottom comprising a layer of surface oxide on the top surface of a conductive layer, said surface oxide formed during the etching of said hole, the organic ILD disposed on said conductive layer over a semiconductor substrate, the method comprising:

displacing organic ILD particles from said sidewall surface and depositing said displaced organic ILD particles at said bottom of said hole while performing a radio frequency (RF) sputter clean of the hole to remove said surface oxide at the bottom of said hole; and removing organic particles displaced from the sidewalls and deposited at the bottom of the hole during the sputter clean by performing an anisotropic, ion enhanced etch of the hole during at least a portion of the sputter clean.

15. The method of claim 14 wherein the hole is part of an interconnect structure and wherein a conductive layer is disposed at the bottom of the hole.

16. The ethod of claim 14, wherein the RF sputter clean comprises an argon plasma.

17. The method of claim 14, wherein the RF sputter clean comprises a helium plasma.

18. The method of claim 14, wherein the anisotropic ion enhanced etch of the organic particles comprises a nitrogen plasma.

19. The method of claim 14, wherein the anisotropic, ion enhanced etch of the organic particles is ion enhanced with an RF bias of between about 0 watts and about 500 watts.

20. The method of claim 14, wherein the RF sputter clean and the anisotropic, ion enhanced etch are performed over about the same time interval.

21. A method of forming an interconnect through an organic ILD, the method comprising:

forming a lower conductive layer having a top surface on a semiconductor substrate;

forming the organic ILD on the lower conductive layer;

etching the organic ILD down to the lower conductive layer to define a hole through said ILD comprising a sidewall surface of said organic ILD and a bottom comprising a layer of oxide on the top surface of said lower conductive layer, said layer of oxide formed during said etching step;

displacing particles from said sidewall surface of said organic ILD and depositing said displaced particles at said bottom of said hole while performing an RF sputter clean of the hole to remove said surface oxide on said exposed surface of said lower conductive layer;

performing an anisotropic, ion enhanced chemical etch of organic ILD material in the hole during at least a portion the RF sputter clean to remove said deposited displaced particles;

forming a plug in the hole; and forming an upper conductive layer on the organic ILD and the plug.

22. The method of claim 21, wherein the anisotropic ion enhanced chemical etch comprises using a nitrogen plasma.

* * * * *

UNITED STATES PATENT AND TRADEMARK OFFICE
CERTIFICATE OF CORRECTION

PATENT NO. : 6,872,652 B2
DATED : March 29, 2005
INVENTOR(S) : Fang

It is certified that error appears in the above-identified patent and that said Letters Patent is hereby corrected as shown below:

Title page,
Item [56], References Cited, FOREIGN PATENT DOCUMENTS, delete "200118846" and insert -- 2001118846 --.

Column 8,
Line 9, delete "nitrogcn" and insert -- nitrogen --.

Signed and Sealed this

Seventh Day of June, 2005

JON W. DUDAS
*Director of the United States Patent and Trademark Office*